US010387601B2

(12) United States Patent
Jayaraman et al.

(10) Patent No.: US 10,387,601 B2
(45) Date of Patent: Aug. 20, 2019

(54) METHODS TO STORE DYNAMIC LAYER CONTENT INSIDE A DESIGN FILE

(71) Applicant: KLA-Tencor Corporation, Milpitas, CA (US)

(72) Inventors: Thirupurasundari Jayaraman, Chennai (IN); Srikanth Kandukuri, Hyderabad (IN); Gordon Rouse, Dublin, CA (US); Anil Raman, Cupertino, CA (US); Kenong Wu, Davis, CA (US); Praveen Gunasekaran, Santa Clara, CA (US); Aravindh Balaji, San Jose, CA (US); Ankit Jain, Ballston Spa, NY (US)

(73) Assignee: KLA-Tencor Corporation, Milpitas, CA (US)

( * ) Notice: Subject to any disclaimer, the term of this patent is extended or adjusted under 35 U.S.C. 154(b) by 74 days.

(21) Appl. No.: 15/358,888

(22) Filed: Nov. 22, 2016

(65) Prior Publication Data

US 2017/0154147 A1 Jun. 1, 2017

Related U.S. Application Data

(60) Provisional application No. 62/294,273, filed on Feb. 11, 2016.

(30) Foreign Application Priority Data

Nov. 26, 2015 (IN) .............................. 6342/CHE/2015

(51) Int. Cl.
*G06F 17/50* (2006.01)

(52) U.S. Cl.
CPC ...... *G06F 17/5072* (2013.01); *G06F 17/5068* (2013.01); *G06F 17/5081* (2013.01)

(58) Field of Classification Search
CPC ... G06F 17/5072; G06F 17/5081; G06F 17/50
See application file for complete search history.

(56) References Cited

U.S. PATENT DOCUMENTS

| 7,570,796 | B2 | 8/2009 | Zafar et al. |
| 7,676,077 | B2 | 3/2010 | Kulkarni et al. |
| 7,747,977 | B1 * | 6/2010 | Lapanik ................. B82Y 10/00 716/50 |

(Continued)

FOREIGN PATENT DOCUMENTS

WO 2008077100 6/2008

OTHER PUBLICATIONS

ISA/KR, International Search Report for PCT/US2016/063506 dated Mar. 7, 2017.

(Continued)

*Primary Examiner* — Vuthe Siek
(74) *Attorney, Agent, or Firm* — Hodgson Russ LLP (57) ABSTRACT

Systems and methods are disclosed for storing dynamic layer content in a design file. A design file is received having design data corresponding to a plurality of process layers. A geometric operation formula is also received. A processor generates a polygon having dynamic layer content that is formed by applying the geometric operation formula on two or more of the plurality of process layers. The updated design file is stored, the design file now having a polygon having dynamic layer content.

17 Claims, 5 Drawing Sheets

(56) References Cited

U.S. PATENT DOCUMENTS

| 9,904,755 B2* | 2/2018 | Bhattacharya ...... G06F 17/5081 |
| 2004/0236711 A1* | 11/2004 | Nixon ............... G06F 17/30271 |
| 2011/0096309 A1 | 4/2011 | Paul Wiaux et al. |
| 2012/0262715 A1 | 10/2012 | Sakai et al. |
| 2013/0091098 A1* | 4/2013 | Hung ................ G06F 17/30091 |
| | | 707/661 |
| 2014/0301629 A1 | 10/2014 | Ramachandran |
| 2014/0303921 A1 | 10/2014 | Jayaraman et al. |
| 2015/0213177 A1* | 7/2015 | De Dood ............ G06F 17/5068 |
| | | 716/122 |

OTHER PUBLICATIONS

ISA/KR, Written Opinion of the International Searching Authority for PCT/US2016/063506 dated Mar. 7, 2017.

* cited by examiner

METHODS TO STORE DYNAMIC LAYER CONTENT INSIDE A DESIGN FILE

CROSS-REFERENCE TO RELATED APPLICATIONS

This application claims priority to U.S. Provisional Application No. 62/294,273, filed on Feb. 11, 2016 and IN Patent Application No. 6342/CHE/2015, filed on Nov. 26, 2015, the disclosures of which are incorporated herein by reference.

FIELD OF THE DISCLOSURE

The present disclosure relates to chip design and defect detection.

BACKGROUND OF THE DISCLOSURE

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of polygons that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an interlevel dielectric, and an interconnect pattern on a metallization layer.

The term "design data" as used herein generally refers to the physical design (layout) of an IC and data derived from the physical design through complex simulation or simple geometric and Boolean operations.

A semiconductor device design is verified by different procedures before production of ICs. For example, the semiconductor device design is checked by software simulation to verify that all features will be printed correctly after lithography in manufacturing. Such checking commonly includes steps such as design rule checking (DRC), optical rule checking (ORC), and more sophisticated software based verification approaches that include process simulation calibrated to a specific fab and process.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etch, deposition, and ion implantation. Multiple semiconductor devices may be fabricated in an arrangement on a single semiconductor wafer and then separated into individual semiconductor devices.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

As design rules shrink, however, semiconductor manufacturing processes may be operating closer to the limitation on the performance capability of the processes. In addition, smaller defects can have an impact on the electrical parameters of the device as the design rules shrink, which drives more sensitive inspections. Therefore, as design rules shrink, the population of potentially yield relevant defects detected by inspection grows dramatically, and the population of nuisance defects detected by inspection also increases dramatically. Therefore, more and more defects may be detected on the wafers, and correcting the processes to eliminate all of the defects may be difficult and expensive. As such, determining which of the defects actually have an effect on the electrical parameters of the devices and the yield may allow process control methods to be focused on those defects while largely ignoring others. Furthermore, at smaller design rules, process induced failures may, in some cases, tend to be systematic. That is, process induced failures tend to fail at predetermined design patterns often repeated many times within the design Elimination of spatially systematic, electrically relevant defects is important because eliminating such defects can have a significant overall impact on yield. Whether or not defects will affect device parameters and yield often cannot be determined from the inspection, review, and analysis processes described above since these processes may not be able to determine the position of the defect with respect to the electrical design.

BRIEF SUMMARY OF THE DISCLOSURE

One embodiment of the present disclosure may be described as a method for storing dynamic layer content in a design file for a chip. The method comprises receiving a design file having design data corresponding to a plurality of process layers. The design file may be received by a processor. The processor may also receive a geometric operation formula. The geometric operation formula may be associated with a specific chip area. The geometric operation formula may be an OR, AND, GROW, and/or SHRINK operation, or any combination thereof.

The method further comprises generating with the processor a polygon having dynamic layer content that is formed by applying the geometric operation formula on two or more of the plurality of process layers.

The method further comprises the processor storing in the design file the polygon having dynamic layer content.

In one embodiment, the method further comprises reading a plurality of cell indexes in the design file. Each cell index may have cell bounds and data corresponding to cell data of the chip. The method further comprises retrieving the cell bounds associated with a cell index, determining whether the cell bounds intersect with a region of interest and whether the cell bounds contain a layer of interest, as well as retrieving the cell data if the cell bounds intersect with a region of interest and contain a layer of interest. In this embodiment, the polygon is generated by applying the geometric operation formula on two or more of the plurality of process layers in the retrieved cell data.

In another embodiment, the method may further comprise detecting one or more architecture-specific outlines in the design file. In this embodiment, the polygon may be formed by applying the geometric operation formula on the one or more architecture-specific outlines.

Another embodiment of the present disclosure may be described as a system for storing dynamic layer content in a design file. The system may comprise a design file storage device configured to store one or more design files. Each design file may have design data corresponding to a plurality of process layers for a chip. The system may further comprise a geometric operation formula database configured to store one or more geometric operation formulas. The geometric operation formula may be an OR, AND, GROW, and/or SHRINK operation, or any combination thereof. The geometric operation formula may correspond to a specific chip or one or more process layers on a chip. In one embodiment, each geometric operation formula is associated with a specific chip structure.

The system may also comprise a processor in electronic communication with the design file storage device and the geometric operation formula database.

The processor may be configured to receive, from the design file storage device, a design file for a specific chip; receive, from the geometric operation formula database, a geometric operation formula; generate a polygon having dynamic layer content by applying the geometric operation formula on two or more of the plurality of process layers of the design file; and update the design file to include the polygon having dynamic layer content.

In another embodiment, each design file has a plurality of cell indexes. Each cell index has cell bounds and cell design data. In this embodiment, the processor is further configured to retrieve the cell bounds associated with a cell index; determine whether the cell bounds intersect with a region of interest; determine whether the cell bounds contain a layer of interest; and retrieve the cell design data if the cell bounds intersect with a region of interest and contain a layer of interest. The polygon may be generated by applying the geometric operation formula on two or more of the plurality of process layers in the retrieved cell design data.

In one embodiment, the processor may be further configured to detect one or more architecture-specific outlines in the design file. In this embodiment, the polygon is generated by applying the geometric operation formula on the one or more architecture-specific outlines.

Another embodiment of the present disclosure may be described as a non-transient computer readable medium containing program instructions for causing a computer to perform the method of receiving, at the computer, a design file having design data corresponding to a plurality of process layers; receiving, at the computer, a geometric operation formula; generating, using the computer, a polygon having dynamic layer content that is formed by applying the geometric operation formula on two or more of the plurality of process layers; and storing in the design file, using the computer, the polygon having dynamic layer content.

In one embodiment, the non-transient computer readable medium may contain program instructions that further cause the computer to read a plurality of cell indexes in the design file, each cell index having cell bounds and data corresponding to cell data of the chip; retrieve the cell bounds associated with a cell index; determine whether the cell bounds intersect with a region of interest; determine whether the cell bounds contain a layer of interest; and retrieve the cell data if the cell bounds intersect with a region of interest and contain a layer of interest. The polygon is generated by applying the geometric operation formula on two or more of the plurality of process layers in the retrieved cell data.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include one or more layers formed upon a substrate. For example, such layers may include, but are not limited to, a resist, a dielectric material, and a conductive material. Many different types of such layers are known in the art, and the term wafer as used herein is intended to encompass a wafer including all types of such layers.

One or more layers formed on a wafer may be patterned or unpatterned. For example, a wafer may include a plurality of dies, each having repeatable patterned features. Formation and processing of such layers of material may ultimately result in completed devices. Many different types of devices such as ICs may be formed on a wafer, and the term wafer as used herein is intended to encompass a wafer on which any type of device known in the art is being fabricated. As used herein, the term "chip" may comprise a collection of ICs designed for a particular purpose.

Although embodiments are described herein with respect to wafers, it is to be understood that the embodiments may be used for another specimen such as a reticle, which may also be commonly referred to as a mask or a photomask. Many different types of reticles are known in the art, and the terms "reticle," "mask," and "photomask" as used herein are intended to encompass all types of reticles known in the art.

The terms "design" and "design data" as used herein generally refer to the physical design (layout) of an IC and data derived from the physical design through complex simulation or simple geometric and Boolean operations. The physical design may be stored in a data structure such as a graphical data stream (GDS) file, any other standard machine-readable file, any other suitable file known in the art, and a design database. A GDSII file is one of a class of files used for the representation of design layout data. Other examples of such files include GL1 and OASIS files and proprietary file formats such as RDF data, which is proprietary to KLA-Tencor, Milpitas, Calif. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In addition, the "design" and "design data" described herein refers to information and data that is generated by semiconductor device designers in a design process and is therefore available for use in the embodiments described herein well in advance of printing of the design on any physical wafers.

Preferably, the "design" or "physical design" as those terms are used herein refer to the design as it would be ideally formed on the wafer. In this manner, a design or physical design described herein would preferably not include features of the design that would not be printed on the wafer such as optical proximity correction (OPC) features, which are added to the design to enhance printing of the features on the wafer without actually being printed themselves. In this manner, in some embodiments, the design for the wafer used for steps described further herein does not include features of the design that will not be printed on the wafer. Each of the steps of the method may be performed as described further herein. The method may also include any other step(s) that can be performed by the design data acquisition subsystem and/or computer subsystem(s) or system(s) described herein. The steps are performed by one or more computer systems, which may be configured according to any of the embodiments described herein. In addition, the method described above may be performed by any of the system embodiments described herein.

For example in one embodiment an image of a reticle generated by a reticle inspection system is used as design data in the design data space. The reticle is used to print the design data on the wafer. In this manner an image or a reticle generated by a reticle inspection system may be used as a substitute for design data. The image of the reticle used in this embodiment may include any suitable image of the reticle generated in any suitable manner by any reticle inspection system known in the art. For example the image of the reticle may be a high magnification optical or electron beam image of the reticle acquired by a high magnification optical reticle inspection system or an electron beam based reticle inspection system respectively. Alternatively the image of the reticle may be an aerial image of the reticle acquired by an aerial imaging reticle inspection system.

Images derived from a reticle image can also serve as a "proxy" for the design data. For example, a reticle image generated by a reticle inspection system or any other suitable imaging system can be used to generate a simulated image illustrating how the reticle image would be printed on a wafer, which can be used us a "proxy" for the design data. In one embodiment, a simulated image illustrating how a reticle image would be printed on the wafer is used as design data in the design data space. In this manner, a simulation of how a reticle image would appear on the wafer surface can also serve as a substitute for the design data. The simulated image may be generated in any manner using any suitable method or system known in the art. The simulated image may be used as a proxy for the design data in any of the embodiments described herein that use design data to perform one or more steps.

In embodiments described herein in which design data is used at least in part, to perform one or more steps, the design data may include any of the design data or design data proxies described above or any combination thereof.

Design-guided inspection enables utilization of design data into wafer inspection, enabling better sensitivity and throughput. It may be advantageous to augment inspection tools with design-guided inspection, thus enabling defect detection despite limitations on speed and optics. The presently disclosed embodiments utilize layers in design data to create derived layer data.

Design data may organize the layout in form of layers, where each layer corresponds to the design intent of the lithography mask used to print/manufacture that layer. Previously, the design data information is static. No methods exist to incorporate derived layer content inside design data.

Figure 1:
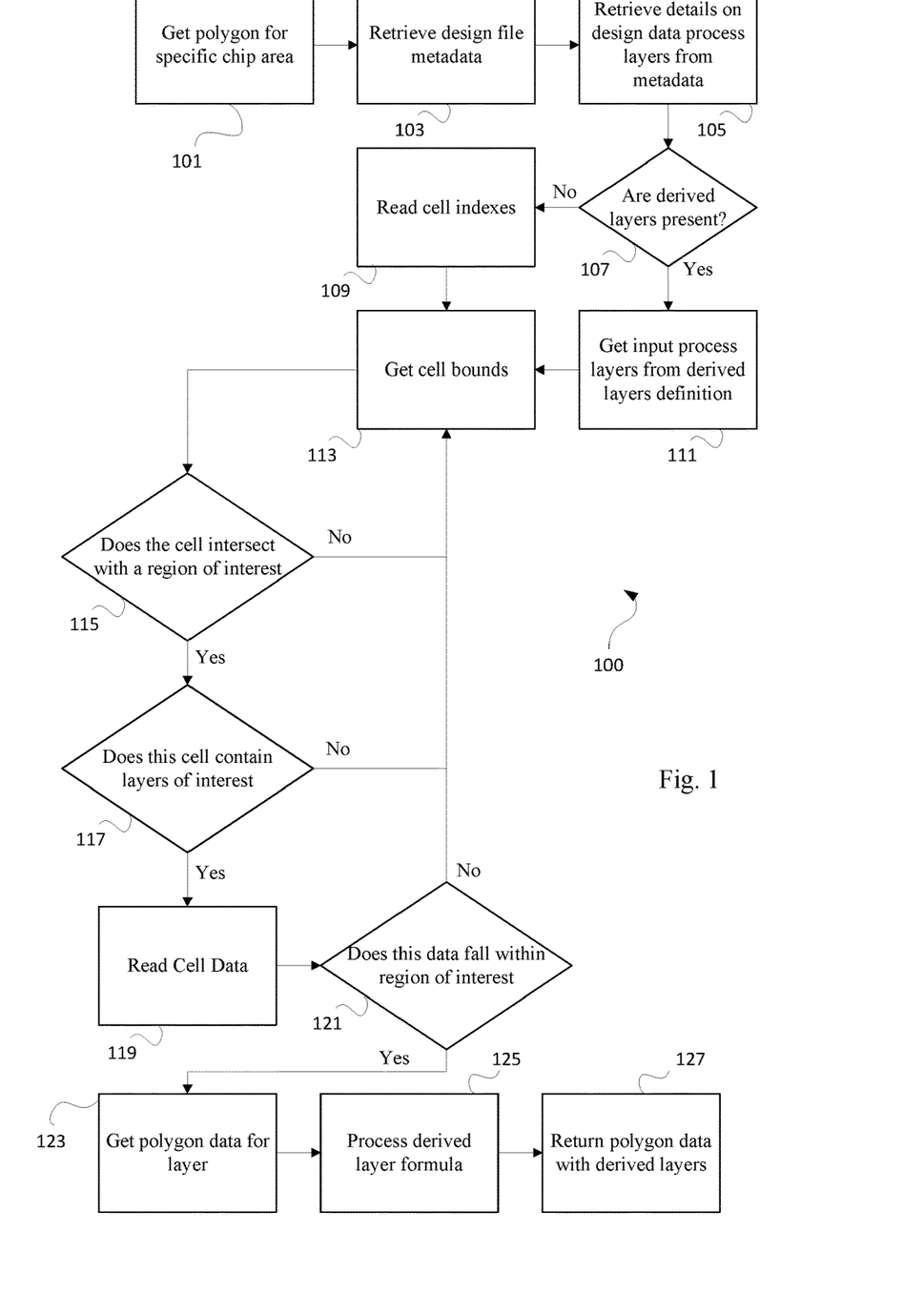
FIG. 1 is a flowchart illustrating one embodiment of the present disclosure.

FIG. 1 describes a method 100 according to one embodiment of the present disclosure. In this method 100, a polygon for a specific chip area is retrieved 101. The polygon may be retrieved 101 using a processor. The processor may comprise a centralized or distributed server. The polygon may be retrieved 101 from an external or internal database, hard drive, or from a user-supplied location. The chip area may be an entire chip or a subset of the chip. For example, the chip area may correspond to a specific structure on a chip.

Design file metadata is retrieved 103. The design file metadata may be stored in a design file or in a manner, such as a separate file, corresponding to a related design file. The design file metadata may be stored on an internal or external database, hard drive, or from a user-supplied location. The design file metadata may include information regarding the chip, tolerances, and other relevant information. Details on the design data process layers are retrieved 105 from the metadata. The design data process layers may be directly stored in the metadata, or the design data process layers may be retrieved 105 by an automated or manual analysis and review of the metadata.

The next step in the method 100 is to determine 107 whether derived layers are present in the design file metadata. If so, input process layers may be retrieved 111 from the derived layers definition. A derived process layer definition includes a formula containing input process layers and one or more operators. The derived process layer is a custom definition that can be interpreted by software. Using this custom metadata definition, software is able to determine whether derived layer is present in design data. If no derived layers are present in the design data or metadata, the cell indexes of the design data are read 109. Cell bounds are retrieved 113. Cell bounds may be arbitrary divisions in the design file or divisions in the design file related to specific or repeated structures in the design file.

The method 110 checks 115 to see whether the cell bounds intersect with a region of interest. The region of interest may correspond to a predetermined region on the chip or in the design file. The region of interest may be stored in the design file metadata. In other embodiments, the region of interest may be provided by the user. In other embodiments, the region of interest may be dynamically created based on feedback from defect discovery tools. If the cell bounds do not intersect with the region of interest, a new cell bound is selected and tested.

If the cell bound intersects with a region of interest, the method 100 checks 117 if the cell contains layers of interest. The layers of interest may correspond to predetermined layers on the chip or in the design file. The layers of interest may be stored in the design file metadata. In other embodiments, the layers of interest may be provided by the user. In other embodiments, the layers of interest may be dynamically created based on feedback from defect discovery tools. If the cell bounds do not intersect with layers of interest, a new cell bound is selected and tested.

If the cell bound contains layers of interest, the cell data is read 119. If the cell data does not fall within a region of interest 121, a new cell bound is selected and tested. If the cell data does contain a region of interest, polygon data for one or more layers is retrieved 123. A process derived layer formula is retrieved 125 and applied to the polygon data. The polygon data is returned 127 with the derived layers.

Figure 2:
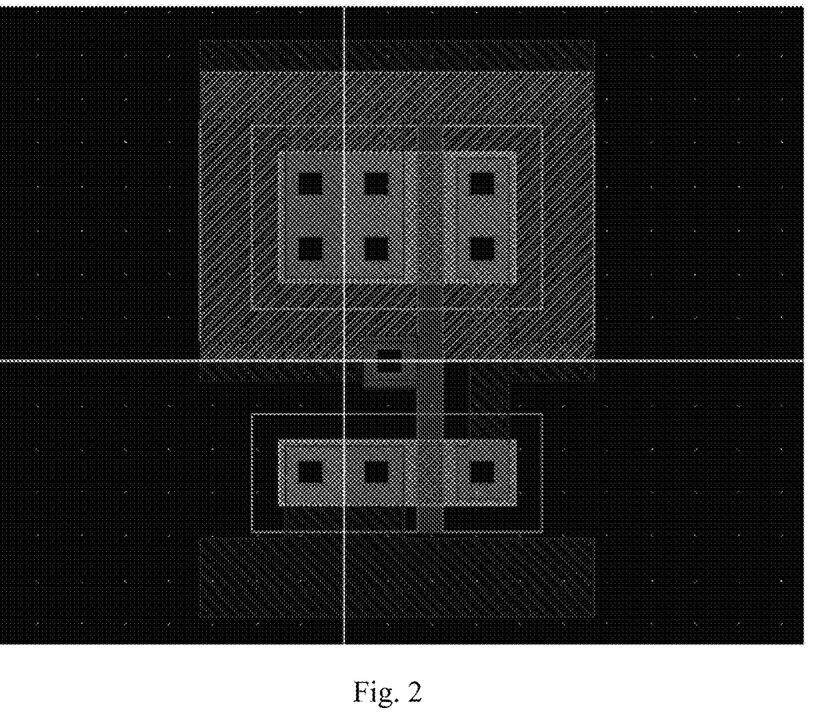
FIG. 2 is a graphical representation of a design file.
Figure 5:
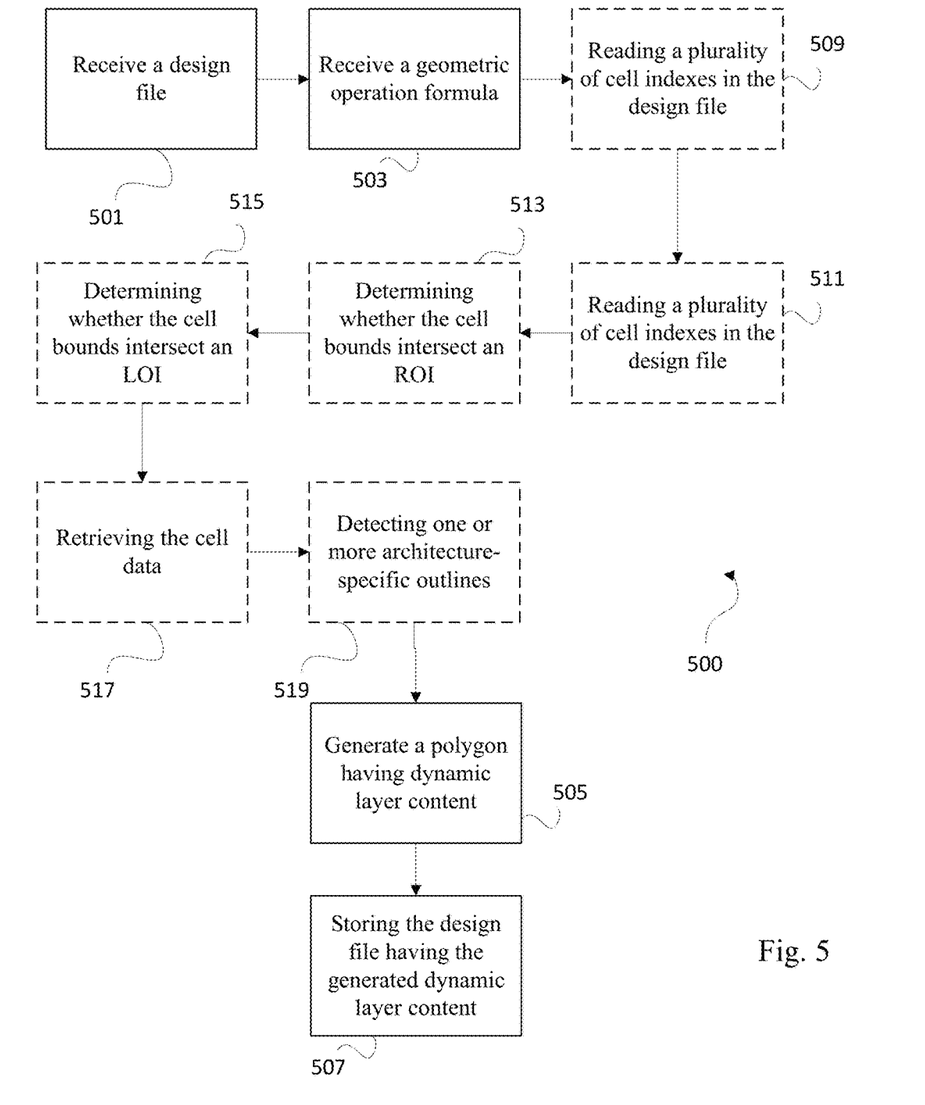
FIG. 5 is a flowchart illustrating other embodiments of the present disclosure.

Another embodiment of the present disclosure can be described as a method 500 for storing dynamic layer content in a design file for a chip. A flowchart describing method 500 is shown in FIG. 5. The method 500 comprises receiving 501 at a processor a design file. The design file as design data corresponding to a plurality of process layers. Examples of the design file includes electronic files in GDS or OASIS (Open Artwork System Interchange Standard) file formats. The design file contains layout information. FIG. 2 is an example of a visual representation of a design file. A design file may organize the layout based on layers. Each layer may correspond to the design intent of the lithography mask used to print or manufacturer that layer.

In one embodiment, the design data in the portions includes design data for more than one design layer. In this manner, the design data used in the methods described herein may be design data for one or more layers of the design. Using design data for one or more layers of the design in the methods described herein may be useful in instances such as when the defects are detected using bright field (BF) inspection, which may detect defects on more than one layer, and if the criticality of a location may depend on what happens on previous or following layers of the design. The method described above may include binning some or all defects of interest into groups with at least similar design data.

Design data may be stored in a database that includes the CAD layout for design data and the context layer or layers for the design data. The database may have suitable configuration known in the art and may include any other data or information described herein. In addition, data in database may be stored in any other suitable data structure. The database may be populated by software using GDSII file and context layer(s) as inputs. In general, the software may be configured as program instructions that are executable on a processor to generate the database using the GDSII file and the context layer(s). Context layer(s) may be acquired or generated in any manner known in the art and may include any context information or data described herein. In addition, GDSII file may be replaced with any other suitable data structure in which design data is stored.

A GDSII file is a database file format which is for data exchange of integrated circuit or IC layout artwork. It is a binary file format representing planar geometric shapes, text labels, and other information about the layout in hierarchical form. The data can be used to reconstruct all or part of the artwork to be used in sharing layouts, transferring artwork between different tools, or creating photomasks.

GDSII files are usually the final output product of the IC design cycle and are given to IC foundries for IC fabrication. Objects contained in a GDSII file are grouped by assigning numeric attributes to them including a "layer number", "datatype" or "texttype". While these attributes were designed to correspond to the "layers of material" used in manufacturing an integrated circuit, their meaning rapidly became more abstract to reflect the way that the physical layout is designed.

Another type of design file is OASIS. OASIS is a language used by computers to represent and express an electronic pattern for an integrated circuit during its design and manufacture. The language defines the code required for geometric shapes such as polygons, rectangles and trapezoids. It defines the type of properties each can have, how they can be organized into cells containing patterns made by these shapes and defines how each can be placed relative to each other. OASIS tries to solve the purported problem of the large size of the GDSII files by introducing a complicated types of the geometric shapes (25 types of trapezoids only) to reduce the data size. Also, variable-length numeric format (similar to Run-length encoding) for coordinates was implemented. Finally, each cell in the OASIS file can be independently compressed by the gzip-like algorithm.

A constrained version of OASIS, called OASIS.MASK, addresses the unique needs of semiconductor photomask manufacturing equipment such as pattern generators and inspection systems. Each line of the OASIS representation below contains a record number and a record type followed by a set of values that define that record type. A cell can be a collection of placed geometric shapes. It also can be a collection of cells; each containing other cells and/or geometric shapes. Each cell must have at least one layer. In this view, each color represents a different layer within the cell. An integrated circuit can contain tens of thousands of unique cells and repeated instances of the same cell.

The method 500 further comprises receiving 503 a geometric operation formula at the processor. The geometric operation formula is configured to perform a geometric operation on two or more layers of a design file. In other words, the geometric operation formula may create a combination polygon based on the two or more layers of the design file. The geometric operation formula may perform grow, then shrink, then grow operations to reduce the time of data that is being returned by the design pipeline. This operation may be particularly useful in electronic design automation systems. Other geometric operation formulas may include XOR which may be useful to illuminate overlaps in various layers, AND which may be useful to get data only in overlapping regions and discard the rest, and OR which may be useful to identify common areas between two layers and derive meaning out of the result.

In some embodiments, the geometric operation formula may be associated with layer content. In other embodiments, the geometric operation formula is created and interpreted at runtime. For example, if the design file has an SRAM outline, the NMOS and PMOS layers may be separately stored in the design file as separate layers. In order to identify SRAM care areas for NMOS regions, the NMOS layer and can be AND'd to the SRAM outline. The same approach can be extended to the PDA (Pixel to Design Alignment, a design based alignment methodology to improve the defect location accuracy reported by the tool) outline layer as well. In this example the OUTLINE_LAYER may be generated 505 by the formula OR(SHRINK (GROW(METAL1, 100 nm), 100 nm)), where METAL1 is a layer in the design file, and 100 nm is the value of which the GROW and SHRINK operations are performed. In essence, this provides a formula driven infrastructure that enables the system to extend design services codes easily for future use cases. In other embodiments, the geometric operation formula is associated with a specific chip area, such as a SRAM area, logic area, SRAM and periphery logic area.

The method 500 further comprises generating 505, using the processor, a polygon having dynamic layer content. The polygon is formed by applying the geometric operation formula on two or more of the plurality of process layers. After the polygon is generated 505, the polygon is stored in the design file and the design file is stored 507, for example in an internal or external database. In some embodiments, the design file may be stored in local memory after a predetermined period of time.

In one embodiment, the method 500 further comprises reading 509, using the processor, a plurality of cell indexes in the design file. Each cell index having cell bounds and data corresponding to cell data of the chip. The cell index may be a numerical value mapped to an area of the design or the chip. The cell bounds may be a physical area of a chip or wafer corresponding to the design file. The cell bounds may be uniform throughout the design file (i.e., of the same size and shape) or they may be non-uniform (i.e., different sizes and/or shapes).

The method 500 may further comprise retrieving 511 using the processor, the cell bounds associated with a cell index. The method 500 may further comprise determining 513, using the processor, whether the cell bounds intersect with a region of interest. The method 500 may further comprise determining 515, using the processor, whether the cell bounds contain a layer of interest. The region of interest may be an area of the chip or design that is prone to defects. The region of interest may be predetermined by the user or dynamically generated by an inspection system. Likewise, the layer of interest may be a layer of the chip or design that is prone to defects. The layer of interest may be predetermined by the user or dynamically generated by an inspection system.

The method 500 may further comprise retrieving 517, using the processor, the cell data if the cell bounds intersect with a region of interest and contain a layer of interest. In one embodiment, the polygon is generated by applying the geometric operation formula on two or more of the plurality of process layers in the retrieved cell data.

In one embodiment, the method 500 may further comprise detecting 519, using the processor, one or more architecture-specific outlines in the design file, wherein the polygon is formed by applying the geometric operation formula on the one or more architecture-specific outlines. For example, an architecture-specific outline may be a trace structure, memory structure, gate structure, or collection of memory and gate structures.

Another embodiment of the present disclosure will be described as a system for storing dynamic layer content in a design file. The system may comprise a design file storage device configured to store one or more design files. Each design file may have design data corresponding to a plurality of process layers for a chip. The system may further comprise a geometric operation formula database configured to store one or more geometric operation formulas. The system may further comprise a processor in electronic communication with the design file storage device and the geometric operation formula database.

The processor may be configured to receive, from the design file storage device, a design file for a specific chip. The processor may also be configured to receive, from the geometric operation formula database, a geometric operation formula. The processor may also be configured to generate a polygon having dynamic layer content by applying the geometric operation formula on two or more of the plurality of process layers of the design file and update the design file to include the polygon having dynamic layer content.

In one embodiment, a design data acquisition subsystem is an inspection system. For example, the optical and electron beam output acquisition subsystems described herein may be configured as inspection systems. In another embodiment, the design data acquisition subsystem is a defect review system. For example, the optical and electron beam output acquisition subsystems described herein may be configured as defect review systems. In a further embodiment, the design data acquisition subsystem is a metrology system. For example, the optical and electron beam output acquisition subsystems described herein may be configured as metrology systems. In particular, the embodiments of the output acquisition subsystems described herein and shown in FIG. 3 may be modified in one or more parameters to provide different imaging capability depending on the application for which they will be used. In one such example, the design data acquisition subsystem shown in FIG. 3 may be configured to have a higher resolution if it is to be used for defect review or metrology rather than for inspection. In other words, the embodiments of the design data acquisition subsystem shown in FIG. 3 describe some general and various configurations for an design data acquisition subsystem that can be tailored in a number of manners that will be obvious to one skilled in the art to produce output acquisition subsystems having different imaging capabilities that are more or less suitable for different applications.

The systems and methods of the present disclosure may utilize output acquisition subsystems, defect review output acquisition subsystems, and metrology design data acquisition subsystems that are configured for inspection, defect review, and metrology of specimens such as wafers and reticles. For example, the embodiments described herein may be configured for using both scanning electron microscopy (SEM) and optical images for the purposes of mask inspection, wafer inspection, and wafer metrology. In particular, the embodiments described herein may be installed on a computer node or computer cluster that is a component of or coupled to an design data acquisition subsystem such as a broadband plasma inspector, an electron beam inspector or defect review tool, a mask inspector, a virtual inspector, etc. In this manner, the embodiments described herein may generate output that can be used for a variety of applications that include, but are not limited to, wafer inspection, mask inspection, electron beam inspection and review, metrology, etc. The characteristics of the output acquisition subsystems shown in FIG. 3 can be modified as described above based on the specimen for which it will generate actual output.

Such a subsystem includes a design data acquisition subsystem that includes at least an energy source and a detector. The energy source is configured to generate energy that is directed to a wafer. The detector is configured to detect energy from the wafer and to generate output responsive to the detected energy.

Figure 3:
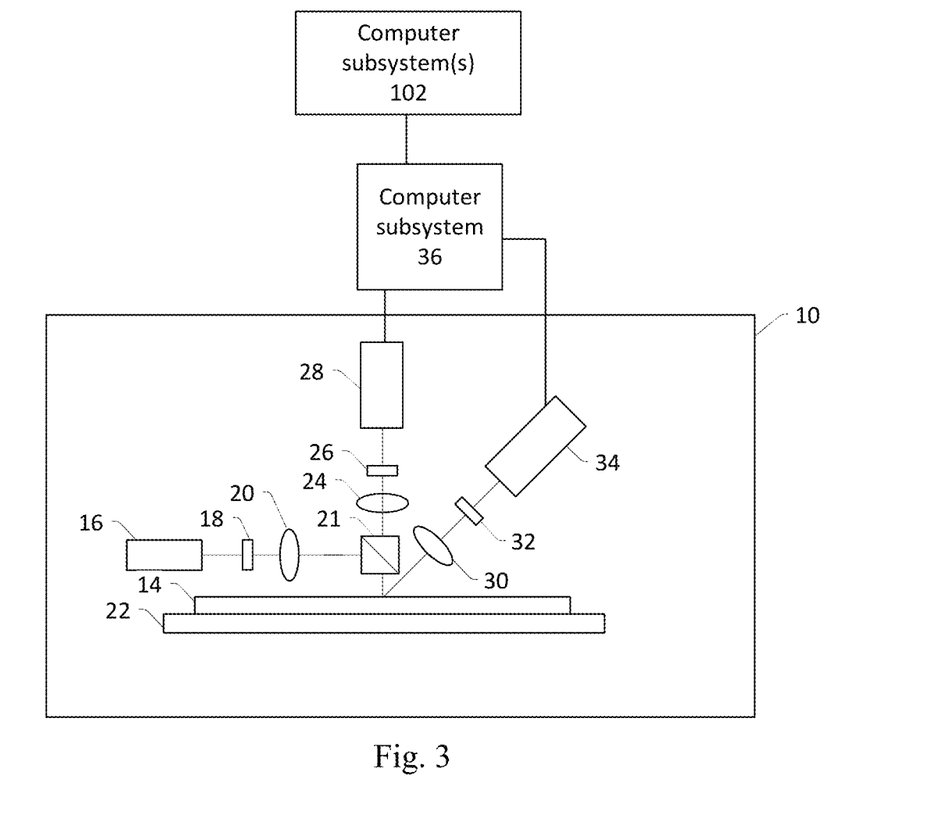
FIG. 3 is a system drawing of a computer system used in conjunction with one embodiment of the present disclosure.

In one embodiment, the energy directed to the wafer includes light, and the energy detected from the wafer includes light. For example, in the embodiment of the system shown in FIG. 3, design data acquisition subsystem 10 includes an illumination subsystem configured to direct light to wafer 14. The illumination subsystem includes at least one light source. For example, as shown in FIG. 3, the illumination subsystem includes light source 16. In one embodiment, the illumination subsystem is configured to direct the light to the wafer at one or more angles of incidence, which may include one or more oblique angles and/or one or more normal angles. For example, as shown in FIG. 3, light from light source 16 is directed through optical element 18 and then lens 20 to beam splitter 21, which directs the light to wafer 14 at a normal angle of incidence. The angle of incidence may include any suitable angle of incidence, which may vary depending on, for instance, characteristics of the wafer.

The illumination subsystem may be configured to direct the light to the wafer at different angles of incidence at different times. For example, the design data acquisition subsystem may be configured to alter one or more characteristics of one or more elements of the illumination subsystem such that the light can be directed to the wafer at an angle of incidence that is different than that shown in FIG. 3. In one such example, the design data acquisition subsystem may be configured to move light source 16, optical element 18, and lens 20 such that the light is directed to the wafer at a different angle of incidence.

In some instances, the design data acquisition subsystem may be configured to direct light to the wafer at more than one angle of incidence at the same time. For example, the illumination subsystem may include more than one illumination channel, one of the illumination channels may include light source 16, optical element 18, and lens 20 as shown in FIG. 3 and another of the illumination channels (not shown) may include similar elements, which may be configured differently or the same, or may include at least a light source and possibly one or more other components such as those described further herein. If such light is directed to the wafer at the same time as the other light, one or more characteristics (e.g., wavelength, polarization, etc.) of the light directed to the wafer at different angles of incidence may be different such that light resulting from illumination of the wafer at the different angles of incidence can be discriminated from each other at the detector(s).

In another instance, the illumination subsystem may include only one light source (e.g., source 16 shown in FIG. 3) and light from the light source may be separated into different optical paths (e.g., based on wavelength, polarization, etc.) by one or more optical elements (not shown) of the illumination subsystem. Light in each of the different optical paths may then be directed to the wafer. Multiple illumination channels may be configured to direct light to the wafer at the same time or at different times (e.g., when different illumination channels are used to sequentially illuminate the wafer). In another instance, the same illumination channel may be configured to direct light to the wafer with different characteristics at different times. For example, in some instances, optical element 18 may be configured as a spectral filter and the properties of the spectral filter can be changed in a variety of different ways (e.g., by swapping out the spectral filter) such that different wavelengths of light can be directed to the wafer at different times. The illumination subsystem may have any other suitable configuration known in the art for directing the light having different or the same characteristics to the wafer at different or the same angles of incidence sequentially or simultaneously.

In one embodiment, light source 16 may include a broadband plasma (BBP) light source. In this manner, the light generated by the light source and directed to the wafer may include broadband light. However, the light source may include any other suitable light source such as a laser. The laser may include any suitable laser known in the art and may be configured to generate light at any suitable wavelength or wavelengths known in the art. In addition, the laser may be configured to generate light that is monochromatic or nearly-monochromatic. In this manner, the laser may be a narrowband laser. The light source may also include a polychromatic light source that generates light at multiple discrete wavelengths or wavebands.

Light from optical element 18 may be focused to beam splitter 21 by lens 20. Although lens 20 is shown in FIG. 3 as a single refractive optical element, it is to be understood that, in practice, lens 20 may include a number of refractive and/or reflective optical elements that in combination focus the light from the optical element to the wafer. The illumination subsystem shown in FIG. 3 and described herein may include any other suitable optical elements (not shown). Examples of such optical elements include, but are not limited to, polarizing component(s), spectral filter(s), spatial filter(s), reflective optical element(s), apodizer(s), beam splitter(s), aperture(s), and the like, which may include any such suitable optical elements known in the art. In addition, the system may be configured to alter one or more of the elements of the illumination subsystem based on the type of illumination to be used for output acquisition.

The design data acquisition subsystem may also include a scanning subsystem configured to cause the light to be scanned over the wafer. For example, the design data acquisition subsystem may include stage 22 on which wafer 14 is disposed during output acquisition. The scanning subsystem may include any suitable mechanical and/or robotic assembly (that includes stage 22) that can be configured to move the wafer such that the light can be scanned over the wafer. In addition, or alternatively, the design data acquisition subsystem may be configured such that one or more optical elements of the design data acquisition subsystem perform some scanning of the light over the wafer. The light may be scanned over the wafer in any suitable fashion.

The design data acquisition subsystem further includes one or more detection channels. At least one of the one or more detection channels includes a detector configured to detect light from the wafer due to illumination of the wafer by the design data acquisition subsystem and to generate output responsive to the detected light. For example, the design data acquisition subsystem shown in FIG. 3 includes two detection channels, one formed by collector 24, element 26, and detector 28 and another formed by collector 30, element 32, and detector 34. As shown in FIG. 3, the two detection channels are configured to collect and detect light at different angles of collection. In some instances, one detection channel is configured to detect specularly reflected light, and the other detection channel is configured to detect light that is not specularly reflected (e.g., scattered, diffracted, etc.) from the wafer. However, two or more of the detection channels may be configured to detect the same type of light from the wafer (e.g., specularly reflected light). Although FIG. 3 shows an embodiment of the design data acquisition subsystem that includes two detection channels, the design data acquisition subsystem may include a different number of detection channels (e.g., only one detection channel or two or more detection channels). Although each of the collectors are shown in FIG. 3 as single refractive optical elements, it is to be understood that each of the collectors may include one or more refractive optical element(s) and/or one or more reflective optical element(s).

The one or more detection channels may include any suitable detectors known in the art. For example, the detectors may include photo-multiplier tubes (PMTs), charge coupled devices (CCDs), and time delay integration (TDI) cameras. The detectors may also include any other suitable detectors known in the art. The detectors may also include non-imaging detectors or imaging detectors. In this manner, if the detectors are non-imaging detectors, each of the detectors may be configured to detect certain characteristics of the scattered light such as intensity but may not be configured to detect such characteristics as a function of position within the imaging plane. As such, the output that is generated by each of the detectors included in each of the detection channels of the design data acquisition subsystem may be signals or data, but not image signals or image data. In such instances, a computer subsystem such as computer subsystem 36 of the system may be configured to generate images of the wafer from the non-imaging output of the detectors. However, in other instances, the detectors may be configured as imaging detectors that are configured to generate imaging signals or image data. Therefore, the system may be configured to generate the images described herein in a number of ways.

It is noted that FIG. 3 is provided herein to generally illustrate a configuration of an design data acquisition subsystem that may be included in the system embodiments described herein. Obviously, the design data acquisition subsystem configuration described herein may be altered to optimize the performance of the system as is normally performed when designing a commercial system. In addition, the systems described herein may be implemented using an existing output acquisition system (e.g., by adding functionality described herein to an existing output acquisition system) such as tools that are commercially available from KLA-Tencor. For some such systems, the methods described herein may be provided as optional functionality of the output acquisition system (e.g., in addition to other functionality of the output acquisition system). Alternatively, the system described herein may be designed "from scratch" to provide a completely new system.

Computer subsystem 36 of the system may be coupled to the detectors of the design data acquisition subsystem in any suitable manner (e.g., via one or more transmission media, which may include "wired" and/or "wireless" transmission media) such that the computer subsystem can receive the output generated by the detectors during scanning of the wafer. Computer subsystem 36 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

If the system includes more than one computer subsystem, then the different computer subsystems may be coupled to each other such that images, data, information, instructions, etc. can be sent between the computer subsystems as described further herein. For example, computer subsystem 36 may be coupled to computer subsystem(s) 102 by any suitable transmission media, which may include any suitable wired and/or wireless transmission media known in the art. Two or more of such computer subsystems may also be effectively coupled by a shared computer-readable storage medium (not shown).

Figure 4:
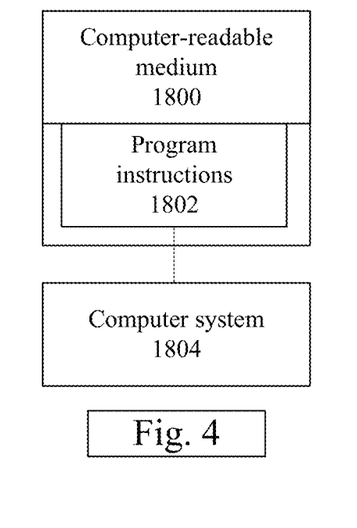
FIG. 4 is a diagram showing a non-transitory computer-readable medium storing program instructions executable on a computer system for performing a computer-implemented method of the present disclosure.

An additional embodiment relates to a non-transitory computer-readable medium storing program instructions executable on a computer system for performing a computer-implemented method for determining overlay error between different patterned features of a design printed on a wafer in a multi-patterning step process. One such embodiment is shown in FIG. 4. In particular, as shown in FIG. 4, non-transitory computer-readable medium 1800 includes program instructions 1802 executable on computer system 1804. The computer-implemented method may include any step(s) of any method(s) described herein.

Program instructions 1802 implementing methods such as those described herein may be stored on computer-readable medium 1800. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, Java-Beans, Microsoft Foundation Classes ("MFC"), SSE (Streaming SIMD Extension) or other technologies or methodologies, as desired.

Computer system 1804 may be configured according to any of the embodiments described herein.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A method for storing dynamic layer content in a design file for a chip comprising:
   receiving, at a processor, a design file having design data corresponding to a plurality of process layers;
   receiving, at the processor, a geometric operation formula;
   reading, using the processor, a plurality of cell indexes in the design file, each cell index having cell bounds and data corresponding to cell data of the chip;
   retrieving, using the processor, the cell bounds associated with a cell index;
   determining, using the processor, whether the cell bounds intersect with a region of interest;
   determining, using the processor, whether the cell bounds contain a layer of interest;

retrieving, using the processor, the cell data if the cell bounds intersect with a region of interest and contain a layer of interest;

generating, using the processor, a polygon having dynamic layer content that is formed by applying the geometric operation formula on two or more of the plurality of process layers in the retrieved cell data;

storing in the design file, using the processor, the polygon having dynamic layer content; and inspecting a wafer with an inspection tool using the design file including the polygon having dynamic layer content.

2. The method of claim 1, wherein the geometric operation formula is associated with a specific chip area.

3. The method of claim 1, wherein the geometric operation formula is an OR operation.

4. The method of claim 1, wherein the geometric operation formula is an AND operation.

5. The method of claim 1, wherein the geometric operation formula is a GROW operation.

6. The method of claim 1, wherein the geometric operation formula is a SHRINK operation.

7. The method of claim 1, further comprising:
detecting, using the processor, one or more architecture-specific outlines in the design file, wherein the polygon is formed by applying the geometric operation formula on the one or more architecture-specific outlines.

8. A system for storing dynamic layer content in a design file comprising:
a design file storage device configured to store one or more design files, each design file having design data corresponding to a plurality of process layers for a chip, wherein each design file has a plurality of cell indexes, each cell index having cell bounds and cell design data;

a geometric operation formula database configured to store one or more geometric operation formulas;

a processor in electronic communication with the design file storage device and the geometric operation formula database, the processor configured to:
receive, from the design file storage device, a design file for a specific chip;
receive, from the geometric operation formula database, a geometric operation formula;
retrieve the cell bounds associated with a cell index;
determine whether the cell bounds intersect with a region of interest;
determine whether the cell bounds contain a layer of interest;
retrieve the cell design data if the cell bounds intersect with a region of interest and contain a layer of interest;
generate a polygon having dynamic layer content by applying the geometric operation formula on two or more of the plurality of process layers in the retrieved cell design data of the design file;
update the design file to include the polygon having dynamic layer content; and an inspection tool in electronic communication with the design file storage device, the inspection tool configured to inspect a wafer using the design file including the polygon having dynamic layer content.

9. The system of claim 8, wherein the geometric operation formula is associated with a specific chip structure.

10. The system of claim 8, wherein the geometric operation formula is an OR operation.

11. The system of claim 8, wherein the geometric operation formula is an AND operation.

12. The system of claim 8, wherein the geometric operation formula is a GROW operation.

13. The system of claim 8, wherein the geometric operation formula is a SHRINK operation.

14. The system of claim 8, wherein the processor is further configured to:
detect one or more architecture-specific outlines in the design file,
wherein the polygon is generated by applying the geometric operation formula on the one or more architecture-specific outlines.

15. The system of claim 8, wherein the geometric operation formula corresponds to the specific chip.

16. The system of claim 8, wherein the geometric operation formula corresponds to one or more process layers on the chip.

17. A non-transient computer readable medium containing program instructions for causing a computer to perform the method of:
receiving, at the computer, a design file having design data corresponding to a plurality of process layers;
receiving, at the computer, a geometric operation formula;
reading, using the computer, a plurality of cell indexes in the design file, each cell index having cell bounds and data corresponding to cell data of the chip;
retrieving, using the computer, the cell bounds associated with a cell index;
determining, using the computer, whether the cell bounds intersect with a region of interest;
determining, using the computer, whether the cell bounds contain a layer of interest;
retrieving, using the computer, the cell data if the cell bounds intersect with a region of interest and contain a layer of interest;
generating, using the computer, a polygon having dynamic layer content that is formed by applying the geometric operation formula on two or more of the plurality of process layers in the retrieved cell data;
storing in the design file, using the computer, the polygon having dynamic layer content; and
instructing, using the computer, an inspection tool to inspect a wafer using the design file including the polygon having dynamic layer content.

* * * * *